(12) United States Patent
Tanaka

(10) Patent No.: US 8,754,493 B2
(45) Date of Patent: *Jun. 17, 2014

(54) SOLID-STATE IMAGING DEVICE AND SOLID-STATE IMAGING DEVICE DESIGNING METHOD

(75) Inventor: Nagataka Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/558,495

(22) Filed: Jul. 26, 2012

(65) Prior Publication Data

US 2012/0286386 A1 Nov. 15, 2012

Related U.S. Application Data

(63) Continuation of application No. 12/552,653, filed on Sep. 2, 2009, now Pat. No. 8,274,123.

(30) Foreign Application Priority Data

Sep. 5, 2008 (JP) .................................. 2008-228328

(51) Int. Cl.
*H01L 31/0232* (2014.01)

(52) U.S. Cl.
USPC .......................................... 257/432; 257/435

(58) Field of Classification Search
USPC ................... 257/431–448, E21.001, E31.003
See application file for complete search history.

(56) References Cited

U.S. PATENT DOCUMENTS

| 5,610,390 | A | 3/1997 | Miyano |
| 5,682,203 | A | 10/1997 | Kato |
| 6,690,049 | B2 | 2/2004 | Suzuki et al. |
| 7,084,472 | B2 * | 8/2006 | Fukuyoshi et al. ........... 257/432 |
| 7,335,963 | B2 | 2/2008 | Ford |
| 7,515,342 | B2 | 4/2009 | Tanaka et al. |
| 7,706,073 | B2 * | 4/2010 | Munro ........................... 359/627 |
| 8,274,123 | B2 * | 9/2012 | Tanaka ........................... 257/432 |
| 2001/0026322 | A1 | 10/2001 | Takahashi et al. |
| 2006/0187553 | A1 | 8/2006 | Tanaka et al. |
| 2009/0079019 | A1 | 3/2009 | Funao |
| 2010/0207225 | A1 | 8/2010 | Masuda |
| 2011/0204463 | A1 | 8/2011 | Grand |

FOREIGN PATENT DOCUMENTS

| JP | 2600250 | 1/1997 |
| JP | 2004-228645 | 8/2004 |
| JP | 2006-237150 | 9/2006 |

OTHER PUBLICATIONS

Office Action issued Nov. 12, 2010, in Chinese Patent Application No. 200910166897.4 with English Translation.

* cited by examiner

*Primary Examiner* — Cuong Q Nguyen
(74) *Attorney, Agent, or Firm* — Oblon, Spivak, McClelland, Maier & Neustadt, L.L.P.

(57) ABSTRACT

A solid-state imaging device includes light receiving sections which are arranged in an image area on a semiconductor substrate at the same pitch and which light exiting from an imaging optical system enters, condensing lenses respectively arranged above the light receiving sections, and light shielding sections each of which is provided at one end of each of the light receiving sections. The condensing lenses are arranged in a peripheral portion in a first direction in the image area at a first pitch, and arranged in a peripheral portion in a second direction opposite the first direction at a second pitch which is smaller than the first pitch.

10 Claims, 9 Drawing Sheets

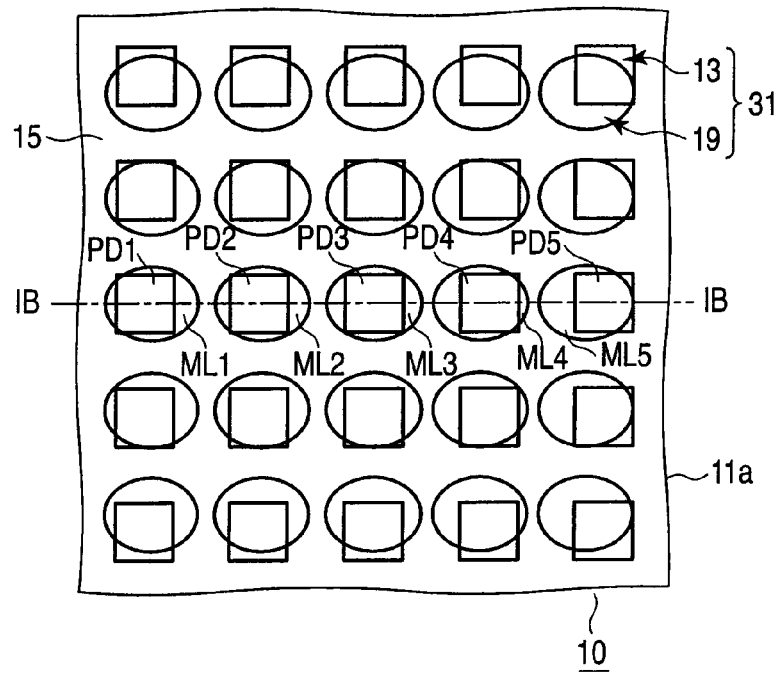
F I G. 1A
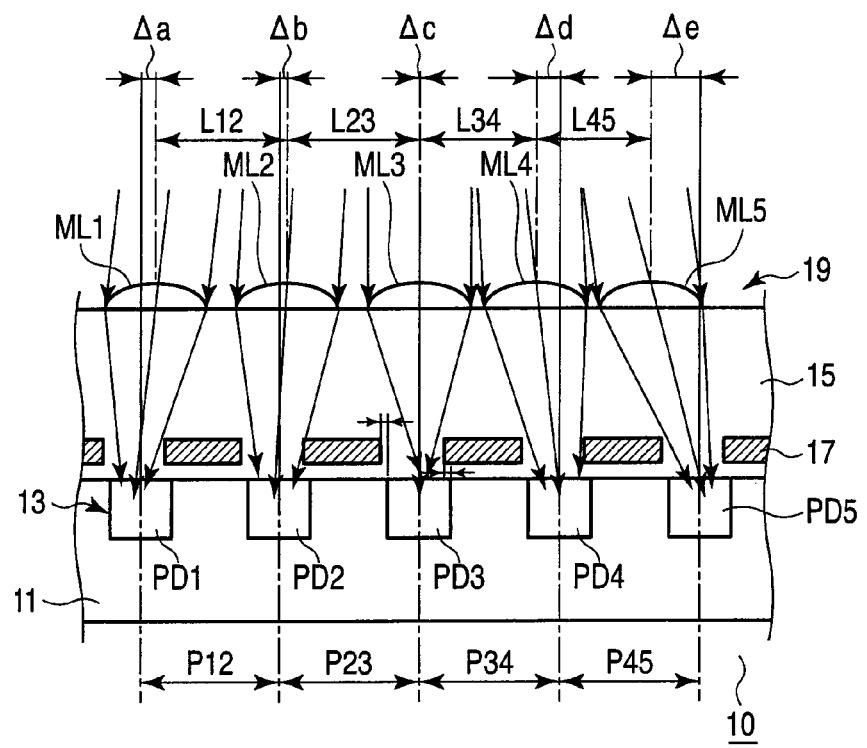
F I G. 1B

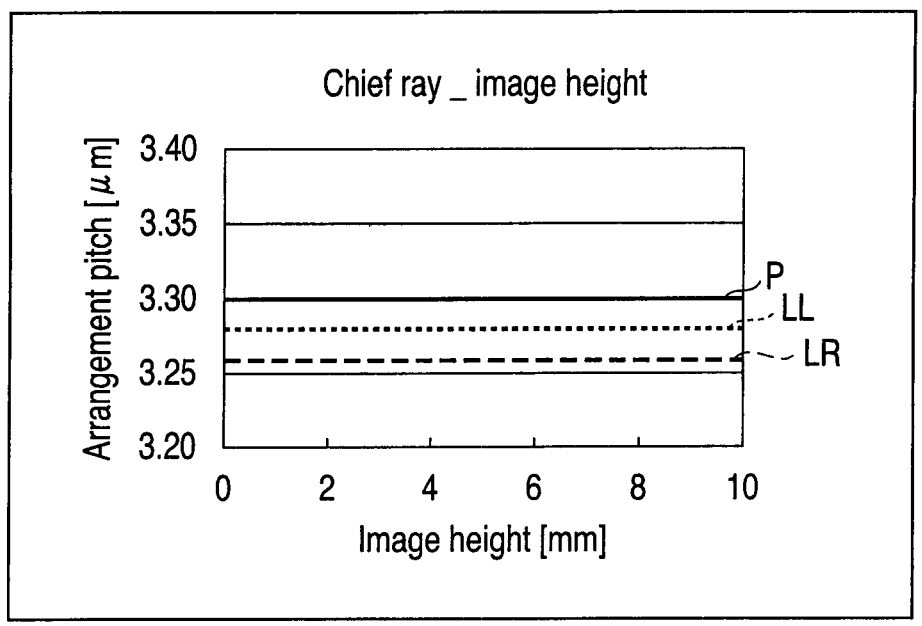
F I G. 2

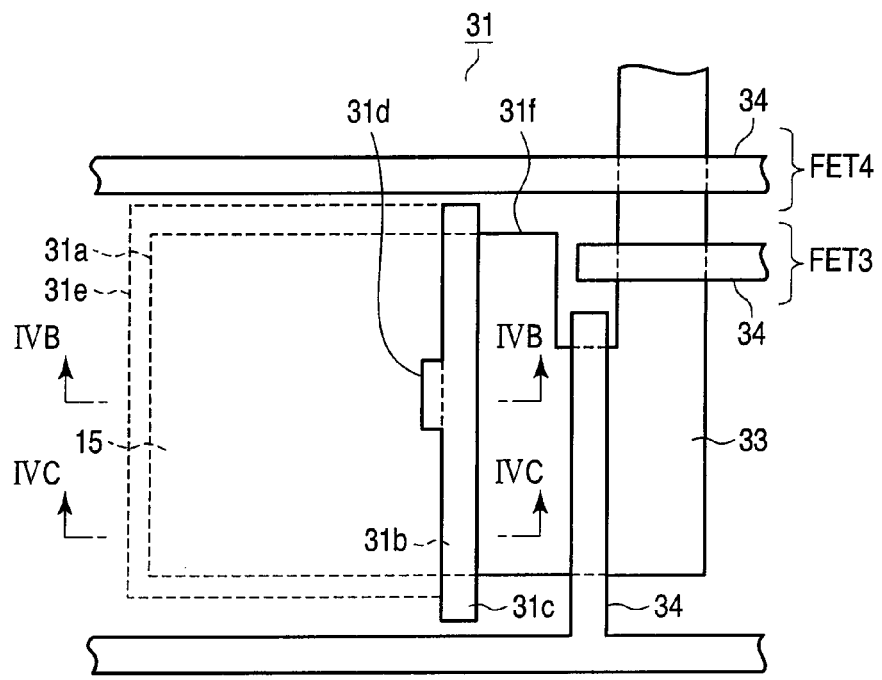
F I G. 4A
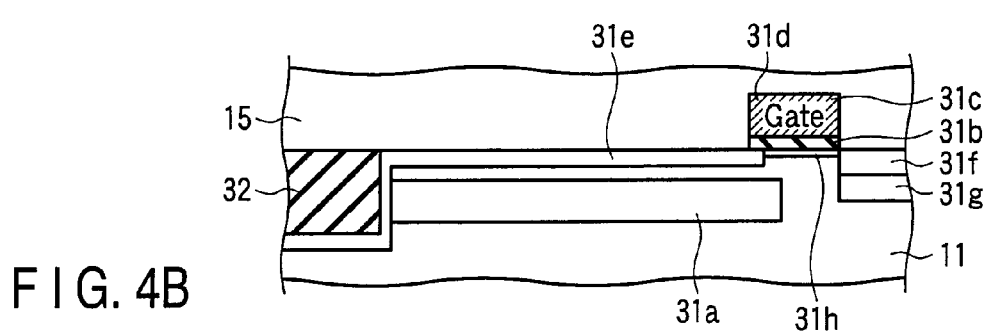
F I G. 4B
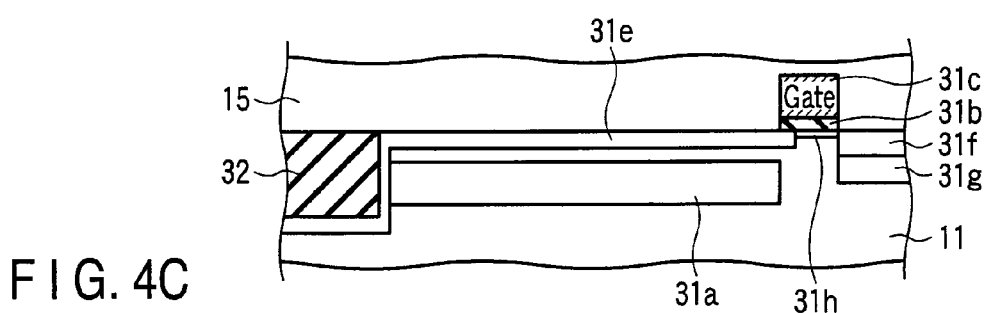
F I G. 4C

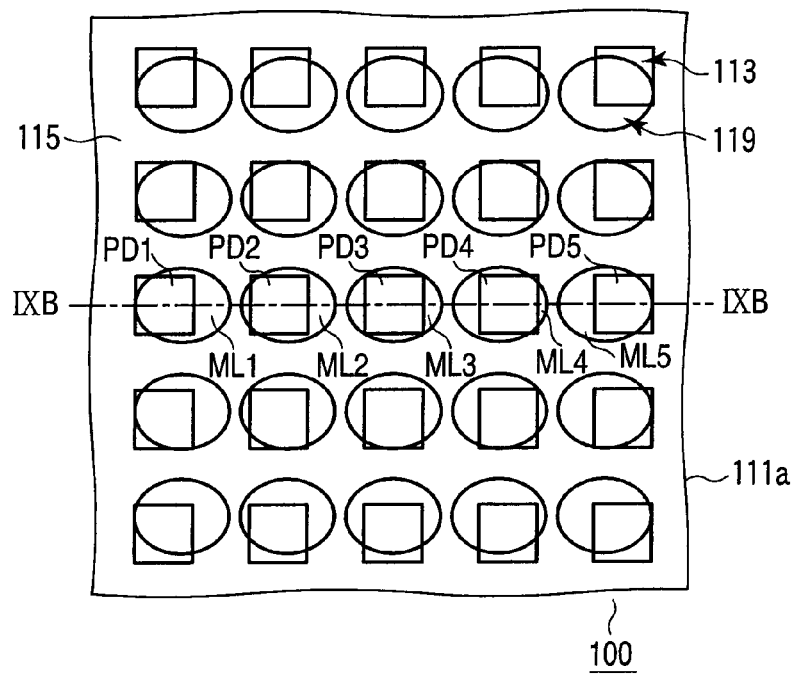
F I G. 9A
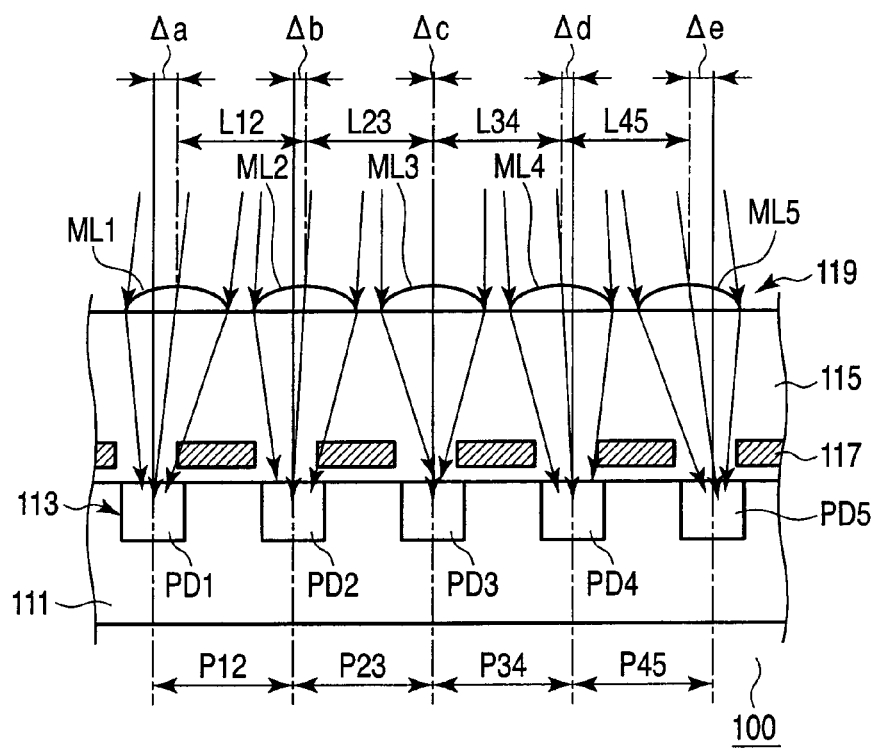
F I G. 9B

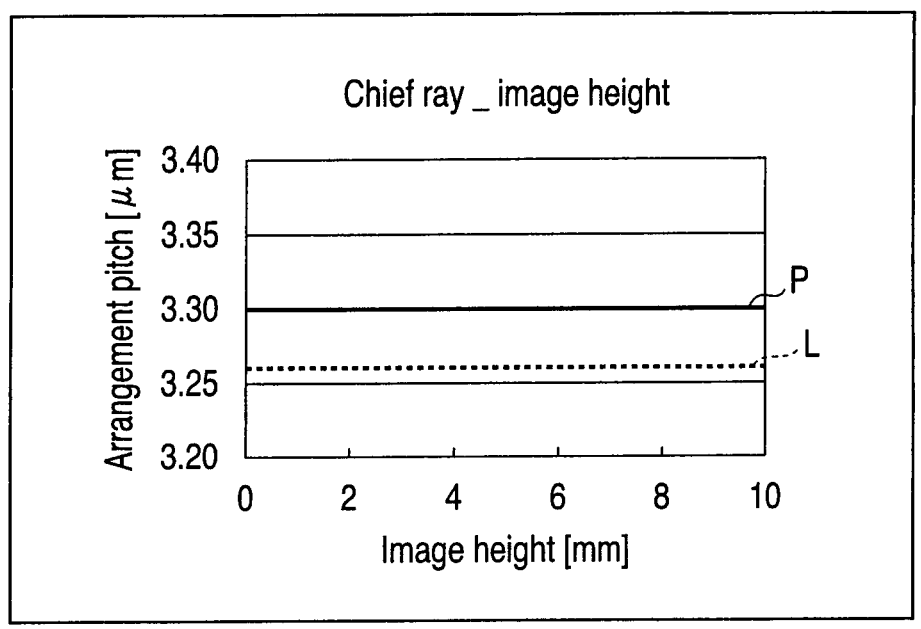
F I G. 10

SOLID-STATE IMAGING DEVICE AND SOLID-STATE IMAGING DEVICE DESIGNING METHOD

CROSS-REFERENCE TO RELATED APPLICATIONS

This application is a continuation of U.S. application Ser. No. 12/552,653 filed Sep. 2, 2009, and is based upon and claims the benefit of priority from prior Japanese Patent Application No. 2008-228328, filed Sep. 5, 2008, the entire contents of each of which are incorporated herein by reference.

BACKGROUND OF THE INVENTION

1. Field of the Invention

The present invention relates to a solid-state imaging device and a designing method thereof. More particularly, the present invention relates to a charged coupled device (CCD) or complementary metal oxide semiconductor (CMOS) image sensor which is incorporated in, e.g., a camera-equipped mobile phone.

2. Description of the Related Art

In, e.g., a camera-equipped mobile phone, a CCD or CMOS image sensor has been conventionally extensively used as a solid-stage imaging device. In such an image sensor, a condensing microlens is provided on a light incidence plane side of a photodiode in each pixel to improve a light detection efficiency.

Usually, an angle of light which exits from a camera lens (an imaging optical system) and enters a photodiode of each pixel differs between the center and a peripheral portion of an image area. Therefore, the larger the image area height, or the further the microlenses are positioned from the center of the image area, the more positions of them are shifted toward the center of the image area from the center of their corresponding photodiodes. This achieves uniformed optical sensitivities (light condensing efficiencies) among pixels.

For, example, for a camera lens having lens characteristics conforming to paraxial beam approximation, arrangement pitches of microlenses are set to be uniformly smaller than those of photodiodes, and each microlens is laid out in such a manner that a shift in position of each microlens from a position of a corresponding photodiode gradually increases as an image height increases (the arrangement pitch of the photodiodes is fixed). That is, light enters the photodiodes in the peripheral portion of the image area at a slant. Therefore, a position of each microlens with respect to a corresponding photodiode is gradually offset toward the center of the image area in a region extending from the center toward the edge of the image area. Pixels laid out in this manner can improve the light condensing efficiencies in the photodiodes in the peripheral portions of the image area. As a result, shading in the peripheral portions of the image area can be corrected, whereby nearly the same light condensing efficiencies can be assured in substantially the entire image region.

Further, as a similar technology, there is an attempt to reduce the shading by setting the arrangement pitch of microlenses to be smaller than that of photodiodes and shifting a position of each microlens in a peripheral portion of an image area toward the center of the image area from the center of a corresponding photodiode (see, for example, Japanese Patent No. 2600250).

On the other hand, in regard to a camera lens having lens characteristics which do not conform to paraxial beam approximation, the following suggestions are already present.

For example, for a camera lens that an exit angle of a chief ray from the final plane of an imaging optical system does not uniformly monotonously increase with a rise in an image height from an optical axis, an arrangement pitch of microlenses in at least a part of a region extending from the center of an image area to a predetermined position in a peripheral portion of the same is reduced and the arrangement pitch of the microlenses in at least a part of the region of the peripheral portion beyond the predetermined position is increased to be larger than the counterpart in the aforesaid region. This can correct the shading (see, for example, Jpn. Pat. Appln. KOKAI Publication No. 2004-228645).

For example, for a camera lens that an exit angle of a chief ray from the final plane of an imaging optical system increases until a given image height from an optical axis is reached and decreases beyond this image height, an arrangement pitch of microlenses in a region with a large absolute value of an exit pupil position of the camera lens is decreased and the arrangement pitch of the microlenses in a region with a small absolute value of the exit pupil position is increased. This can assure nearly the same light condensing efficiencies in an entire image area (see, for example, Jpn. Pat. Appln. KOKAI Publication No. 2006-237150).

However, in a recent image sensor, the layout of interconnects including gate electrodes is becoming difficult with miniaturization of pixels, it is unavoidable that the interconnects block a part of incident light to lose a part of light entering photodiodes. For example, for an image sensor with a pixel pitch (an arrangement pitch of photodiodes) of 1.4 µm, assuming that one interconnect with width of 0.2 µm lies between photodiodes, a distance between the interconnect and each photodiode is 0.6 µm based on an expression (1.4 µm−0.2 µm)/2=0.6 µm. A wavelength of reflected light from a red subject is approximately 600 to 700 nm. Therefore, considering a wave-optical effect, an image sensor having a small pixel pitch must be designed on the assumption that a part of incident light is lost by interconnects.

That is, when laying out interconnects becomes difficult as miniaturization of pixels advances, the layout of pixels is horizontally or vertically asymmetric with respect to the center of each photodiode depending on the layout of the interconnects (note that layouts of the pixels are uniform in an image area). For example, it is assumed that a gate electrode is arranged on a right-hand side of a photodiode in each pixel. Then, the gate electrode partially covers the right-hand side of the photodiode. Therefore, the gate electrode blocks more incident lights in pixels in a left peripheral portion of an image area than in a right peripheral portion. That is, since incident light enters in different angles between in the left peripheral portion and the right peripheral portion of the image, the pixels in the left peripheral portion has more losses of the incident lights blocked by the gate electrodes. It is possible to provide the gate electrode (e.g., a dummy interconnect) on the left-hand side of the photodiode to likewise cover the left-hand side of the photodiode to equalize the blockade of the incident lights by the gate electrodes. This approach, however, is not suitable for miniaturization. Therefore, an image sensor that has increasing difficulties to secure a margin between interconnects due to miniaturized pixels faces an obstacle that blocks improving of the light condensing efficiencies in the entire image area unless a shift of each microlens with respect to a corresponding photodiode is controlled with the interconnects layout considered.

BRIEF SUMMARY OF THE INVENTION

According to a first aspect of the present invention, there is provided a solid-state imaging device comprising: light receiving sections which are arranged in an image area on a semiconductor substrate at the same pitch and which light exiting from an imaging optical system enters; condensing lenses arranged above the light receiving sections, respectively; and light shielding sections each of which is provided at one end of each of the light receiving sections, wherein the condensing lenses are arranged in a peripheral portion in a first direction in the image area at a first pitch and arranged in a peripheral portion in a second direction opposite the first direction at a second pitch which is smaller than the first pitch.

According to a second aspect of the present invention, there is provided a method of designing the solid-state imaging device according to the first aspect, comprising: calculating an optical sensitivity of each of the light receiving sections that exiting light from the imaging optical system enters through the condensing lenses; based on the calculation, calculating an optimal shift of each of the condensing lenses from the center of one of the light receiving sections in a direction toward the center of the image area at each image height; and designing a layout of the condensing lenses in accordance with the optimal shifts.

According to a third aspect of the present invention, there is provided a method of designing the solid-state imaging device according to the first aspect, comprising: determining a layout of the light receiving sections; obtaining lens characteristics of the imaging optical system; calculating optical sensitivity dependence with respect to a shift of each of the condensing lenses at each image height; based on the calculation, calculating an optimal shift of each of the condensing lenses at each image height; creating a contour drawing in accordance with the optimal shifts; and designing a layout of the condensing lenses based on the contour drawing.

BRIEF DESCRIPTION OF THE SEVERAL VIEWS OF THE DRAWING

FIGS. 1A and 1B show an exemplary structure of a solid-state imaging device (a CMOS sensor) according to a first embodiment of the present invention, wherein FIG. 1A is a plan view and FIG. 1B is a cross-sectional view taken along line IB-IB;

FIG. 2 is a view for explaining arrangement pitches of photodiodes and microlenses at each image height in the CMOS image sensor depicted in FIGS. 1A and 1B;

FIGS. 3A and 3B show an exemplary application of the CMOS image sensor depicted in FIGS. 1A and 1B, wherein FIG. 3A is a cross-sectional view showing a basic configuration of a camera module and FIG. 3B is a side view showing a relationship between the CMOS image sensor and camera lenses;

FIGS. 4A to 4C show an exemplary structure of a pixel in the CMOS image sensor depicted in FIGS. 1A and 1B, wherein FIG. 4A is a plan view, FIG. 4B is a cross-sectional view taken along line IVB-IVB, and FIG. 4C is a cross-sectional view taken along line IVC-IVC;

FIGS. 9A and 9B are structural views showing a conventional CMOS image sensor for comparison; and FIG. 10 is a view for explaining arrangement pitches of photodiodes and microlenses in the conventional CMOS image sensor for comparison.

DETAILED DESCRIPTION OF THE INVENTION

Figure 3A:
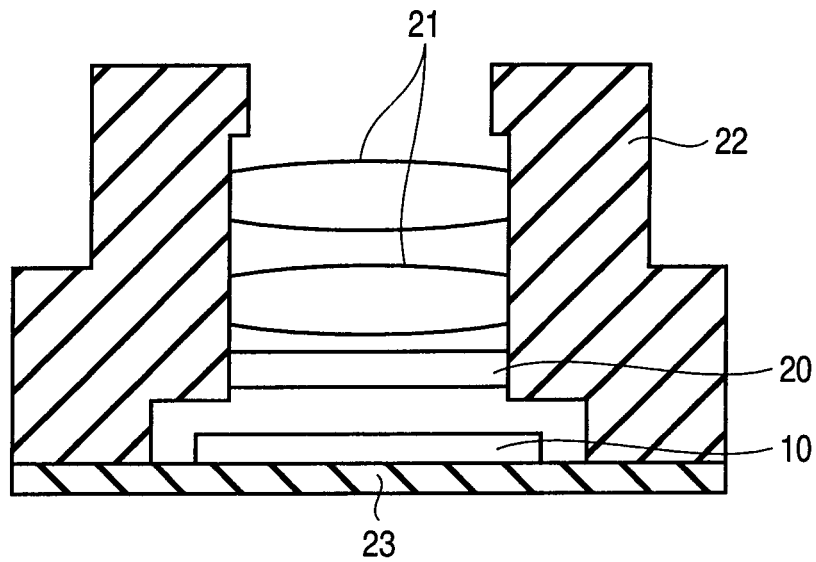

Embodiments of the present invention will be described with reference to the accompanying drawings. It should be noted that the drawings are schematic ones and so are not to scale. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

FIGS. 1A and 1B show a basic configuration of a solid-state imaging device according to a first embodiment of the present invention. In this embodiment, a CMOS area sensor (a CMOS image sensor) incorporated in, e.g., a camera-equipped mobile phone will be taken as an example and described. This is an example where a scaling amount (which will be referred to as a shift hereinafter) of each microlens (a condensing lens) is changed based on a position (an image height) of a pixel in an image area in regard to use of each camera lens (an imaging optical system) having lens characteristics conforming to paraxial beam approximation, thereby enabling light exiting from the final plane of the camera lens to efficiently enter photodiodes (a light receiving section). In particular, a description will be given as to an example to avoid a reduction in a light condensing efficiency in a peripheral portion of the image area is avoided and improve (or reduce) shading characteristics. However, this embodiment is an example which can solve a problem that a shift of each microlens cannot be optimally set in a pixel in either a left or right peripheral portions through setting an arrangement pitch of the microlenses to differ depending on peripheral portion in a left/right direction (an X direction) of the image area (note that a pixel pitch is fixed in the image area). FIG. 1A is a plan view of an image area 11a in a CMOS image sensor 10, and FIG. 1B is a cross-sectional view taken along line IB-IB in FIG. 1A.

As shown in FIGS. 1A and 1B, the image area 11a is formed in a surface portion of a semiconductor substrate 11. Photodiodes (PDs) 13 are two-dimensionally arranged in the image area 11a. In this embodiment, the photodiodes 13 have the same arrangement pitch P (P12=P23=P34=P45).

A translucent film 15 having a uniform thickness is provided on the surface of the semiconductor substrate 11. Interconnects 17 including gate electrodes required to drive each photodiode 13 are provided in translucent film 15. The interconnects 17 also function as light shielding films. The interconnects 17 are provided in proximity to, e.g., the photodiodes 13 and they are arranged to overlap partially with only a right-hand side of each photodiode 13. That is, the layout of the interconnects 17 with respect to the photodiodes 13 differs between in the right-hand side and the left-hand side of each photodiode 13.

On the other hand, condensing microlenses (MLs) 19 are provided on the surface of the translucent film 15 above corresponding photodiodes 13. In this embodiment, an arrangement pitch L of the microlenses 19 is not uniform in the image area 11a, and the arrangement pitch L is small in the right peripheral portion of the image area 11a and it is large in the left peripheral portion of the same, more specifically, for example, L12=L23>L34=L45. Furthermore, the arrangement pitch L of the microlenses 19 is smaller than the arrangement pitch P of the photodiodes 13 (L12=L23>L34=L45<P12=P23=P34=P45).

It is to be noted that more pixels are laid out in the image area in the actual CMOS image sensor.

FIG. 2 shows a relationship between the arrangement pitches of the photodiodes and the microlenses at each image height.

In this embodiment, the arrangement pitch P of the photodiodes 13 is fixed (e.g., 3.30 μm) at any image height. In contrast, the arrangement pitch L of the microlenses 19 is different between in the left and right peripheral portions of the image area 11a. For example, the arrangement pitch L in the left peripheral portion (LL) is 3.28 μm, and the arrangement pitch L in the right peripheral portion (LR) is 3.26 μm.

Such smaller arrangement pitch of the microlenses 19 in the right peripheral portion LR than that in the left peripheral portion LL (LR<LL) results in a larger shift Δ of the microlens 19 from the center of the corresponding photodiode 13 toward the center of the image area 11a in pixels in the right peripheral portion of the image area 11a than those in the left peripheral portion in each image height.

For example, as shown in FIG. 1B, assuming that a photodiode PD3 placed at the center of the image area 11a among the photodiodes 13 is a photodiode at the centre of a camera lens (not shown), a shift Δ of a microlens ML1 from the center of a photodiode PD1, which is in the left peripheral portion of the image area 11a, is Δa. In contrast, a shift Δ of a microlens ML5 from the center of a photodiode PD5, which is in the right peripheral portion of the image area 11a, is Δe. Δe is larger than Δa (Δe>Δa>0). A shift Δ of a microlens ML2 from the center of a photodiode PD2, which is in the left peripheral portion of the image area 11a, is Δb. A shift Δ of a microlens ML4 from the center of a photodiode PD4, which is in the right peripheral portion of the image area 11a, is Δd. Δd is larger than Δb (Δd>Δb>0). A shift Δ of a microlens ML3 from the center of a photodiode PD3 is Δc, which equals to 0.

When the layout of each interconnect 17 with respect to the corresponding photodiode 13 is not laterally symmetrical (isotropic) in each pixel, for example, when the gate electrodes partially overlap only the right-hand side of the corresponding one photodiode 13 as explained above, the optimal shift Δ of the microlens 19 differs in the left or right peripheral portion of the image area 11a. That is, an incident angle of light to a pixel in the left peripheral portion of the image area 11a differs from that in the right peripheral portion due to a difference in distance from the center of the photodiode 13 to the neighboring left or right interconnects 17. Therefore, setting the arrangement pitch L of the microlenses 19 different in the left and right peripheral portions of the image area 11a can suppress the blockade of a part of the incident light by the interconnects 17, and therefore can improve the light condensing efficiencies for the incident light in all the photodiodes 13. That is, setting each optimal shift Δ for each microlen 19 in the left or right peripheral portion in accordance with each image height so as to result in maximum optical sensitivity of the photodiode 19 allows for nearly the same condensing efficiencies in substantially the entire image area 11a.

It is to be noted that, although the shift Δ differs in the left and right peripheral portions, pixels further from the center of the image area 11a have larger optimum shift Δ in both the left and right peripheral portions of the image area 11a (Δa>Δb, Δe>Δd, Δe>Δa) with much larger optimum shift Δ in a pixel with a larger image height.

Figure 3B:
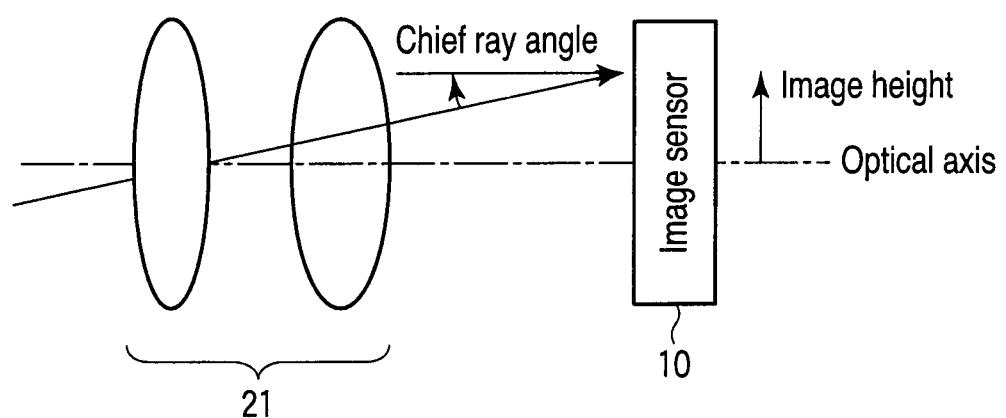

FIGS. 3A and 3B show an exemplary application of the CMOS image sensor depicted in FIGS. 1A and 1B.

FIG. 3A shows an example where the CMOS image sensor 10 is mounted in a camera module. For example, an IR cut filter 20 and camera lenses 21 are arranged above the CMOS image sensor 10. Both the IR cut filter 20 and the camera lenses 21 are fixed to a sensor mounting section 23 in the camera module by a lens holder 22.

FIG. 3B shows a relationship between the CMOS image sensor 10 and the camera lenses 21 in the camera module having the above-described configuration. That is, light exiting from the final plane of the camera lenses 21 enters photodiodes 13 on the CMOS image sensor 10 at chief ray incident angles, which is determined in accordance with positions of pixels, and an image is formed with an image height determined in accordance with the main beam incidence angle.

Here, "chief ray" means a light beam at the center of a light flux that forms an image at a given point (a pixel), and "image height" means a distance from an optical axis on an image forming plane to a given point. Light beams other than the center light (the chief ray) in a light flux which forms an image on a given point refers to "upper and lower light beams".

FIGS. 4A to 4C show an exemplary structure of a pixel 31 in the CMOS image sensor 10. FIG. 4A is a plan view mainly showing one pixel 31, FIG. 4B is a cross-sectional view taken along line IVB-IVB in FIG. 4A, and FIG. 4C is a cross-sectional view taken along line IVC-IVC in FIG. 4A.

The substantially rectangular pixel 31 includes the photodiode 13, the interconnect 17, the microlens 19 and others. That is, a second-conductivity-type first semiconductor region 31a is provided in the semiconductor substrate 11 (of, e.g., a first conductivity type) apart from the surface of the semiconductor substrate 11. An insulating film 31b is provided on the surface of the semiconductor substrate 11. A conductor 31c is provided on the insulating film 31b. The conductor 31c is provided above a right-hand side of the first semiconductor region 31a in such a manner that a convex portion 31d covers a part of the first semiconductor region 31a. A first-conductivity-type third semiconductor region (a surface shield layer) 31e is provided in a surface portion of the semiconductor substrate 11. In this example, the third semiconductor region 31e is provided above the first semiconductor region 31a through the semiconductor substrate 11. The third semiconductor region 31e is in contact with a side surface of the first semiconductor region 31a. A part of the third semiconductor region 31e lies blow the conductor 31c.

A second-conductivity-type fourth semiconductor region 31f is provided in the surface portion of the semiconductor substrate 11. A distance between the fourth semiconductor region 31f and the conductor 31c is equal to a thickness of the insulating film 31b. A sixth semiconductor region 31g is provided below the fourth semiconductor region 31f. The sixth semiconductor region 31g prevents the punch-through.

A second-conductivity-type second semiconductor region 31h is provided in the surface portion of the semiconductor substrate 11. The second semiconductor region 31h is provided below the conductor 31c, especially below the convex portion 31d. The second semiconductor region 31h is in contact with a side surface of the third semiconductor region 31e as well as with a side surface of the fourth semiconductor region 31f.

An insulator 32 is provided below the surface of the semiconductor substrate 11. A side surface and a lower surface of the insulator 32 are in contact with the third semiconductor region 31e. This insulator 32 defines a region for the photodiode 13 in each pixel 31.

The third semiconductor region 31e serves as a photoelectric converting section that is used to obtain a signal charge from incident light. The first semiconductor region 31a serves as a signal storage section in which the signal charge obtained by photoelectric conversion is stored. The first and third semiconductor regions 31a and 31e constitute the photodiode 13. The conductor 31c is a gate electrode of a field-effect transistor FFT1 that enables the signal charge to be discharged from the first semiconductor region 31a. The second semiconductor region 31h is a channel region (a channel implantation layer) of the transistor FET1.

The conductor 31c as the gate electrode has the maximum gate length at the convex portion 31d. The convex portion 31d is a protrusion, and it is provided at a substantially center of a section that defines a gate width. The third semiconductor region 31e is provided below the convex portion 31d. A side surface of the third semiconductor region 31e may be arranged below a side surface of the convex portion 31d.

An active region 33 is connected with the fourth semiconductor region 31f. Conductors 34 are provided above the active region 33 with an insulating film (not shown) between them. Conductors 34 serve as gate electrodes of a field-effect transistor FET2, FET3, and FET4. The conductor 31c and the conductors 34 form the interconnects 17 described above.

Usually, the layout of the pixel 31 is laterally asymmetrical due to a difference in layout of the interconnects 17. This makes difference in an optimal angle of incident light between the left or right peripheral portion of the image area 11a even between the pixels with the same image height. That is, light only needs to enter the pixel 31 in the right peripheral portion from an upper left side without any special measures, but it must be maneuvered avoid the interconnects 17 to enter the pixel 31 in the left peripheral portion from an upper right side.

Figure 5:
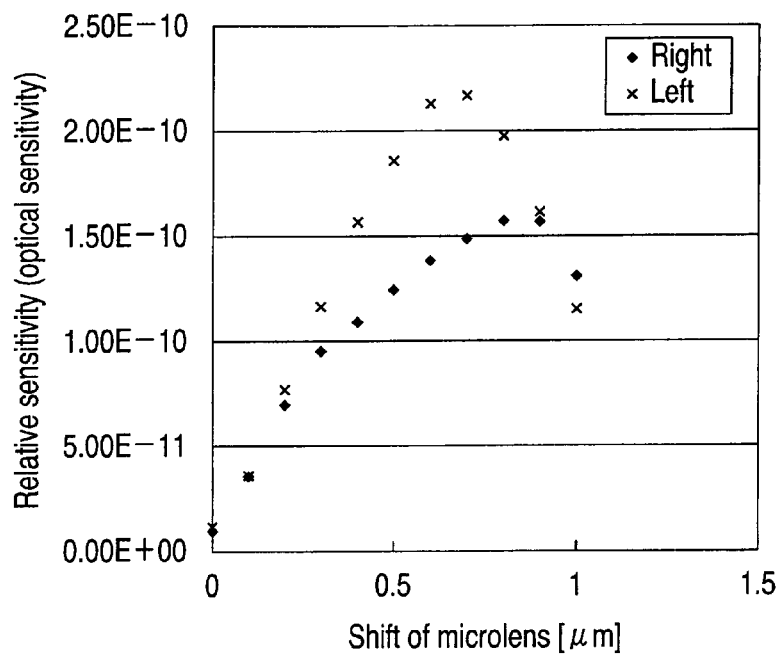
FIG. 5 is a view comparing a relationship between a shift of a microlens and optical sensitivity dependence in regard to a pixel at a right-end and left-end portions in an image area.

FIG. 5 shows a simulated optical sensitivities of the pixels in the left and right peripheral portions of the image area (a shift of the microlens—optical sensitivity dependence) with a pixel pitch (the arrangement pitch P of the photodiodes) of 1.4 μm.

In case of this image sensor, interconnects are arranged at the only right-hand side of the photodiode with the gate electrode protruding above the photodiode. Therefore, as shown in, e.g., FIG. 1B, a distance from the center of the photodiode to the left interconnect is different from that to the right interconnect. In addition to this, an incidence direction of light differs in pixels in the left-hand side peripheral portion of the image area and those in the right side peripheral portion. Therefore, optimal angles for the incidence direction of the light are laterally asymmetrical in the image area.

Thus, optical sensitivities of the pixels placed at left and right ends of the image area were actually measured while changing positions of the microlenses, and then it was revealed that the pixel at the right has an optimal shift different from that of the pixel at the left end as shown in, e.g., FIG. 5. As apparent from this drawing, the shift (the arrangement pitch) of the microlens in the right peripheral portion of the image area must be higher than that in the left peripheral portion in order to optimally set the shift in pixels at the right end and the left end.

Enabling the shift of the microlens to be independently set in the left and right peripheral portions of the image area as described above can solve the problem that the shift of the microlens cannot be optimally set in either one of the left and right pixels in the image area even with miniaturized pixels (especially, even with a decreased margin of the layout of the interconnects due to miniaturization).

Figure 6:
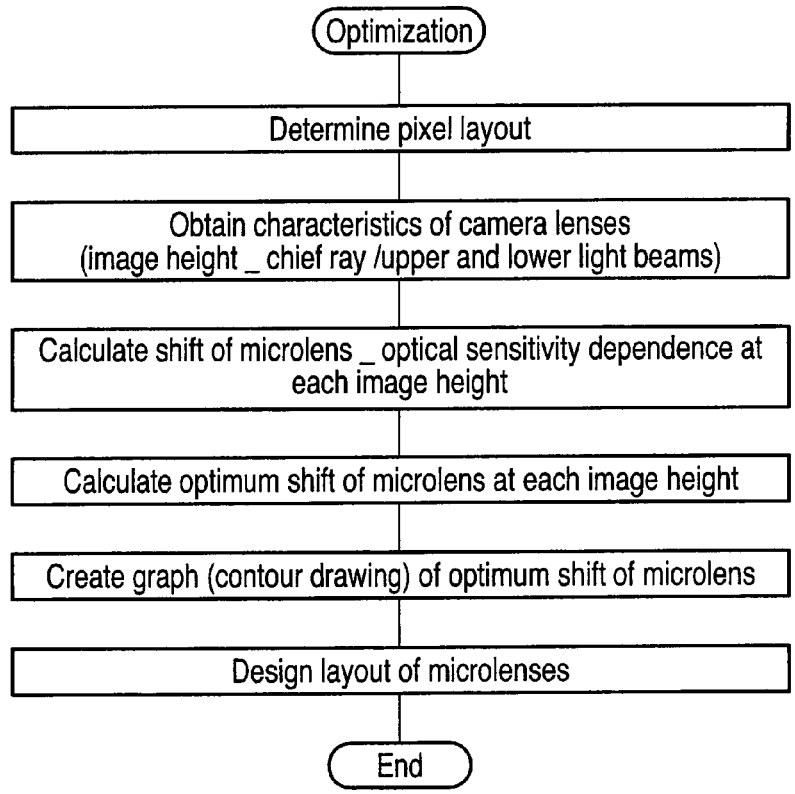
FIG. 6 is a flowchart for explaining a method of optimally setting a shift of the microlens when designing the CMOS image sensor depicted in FIGS. 1A and 1B.

FIG. 6 shows a method that enables optimally setting the shift of each microlens in designing stage of the CMOS image sensor 10 depicted in FIGS. 1A and 1B.

For example, when designing the CMOS image sensor, the following steps are carried out.

(1) The layout of the pixels 31 is determined.

(2) Lens characteristics (an image height—a chief ray/upper and lower light beams) of the camera lenses 21 are obtained.

(3) Then, in regard to each image height, "a shift of each microlens—optical sensitivity dependence" is calculated. In this calculation, the image area 11a is virtually divided into regions along both the X and Y directions, and an optical sensitivity with respect to a particular pixel 31 in each region is simulated. For example, when the image area 11a is divided into 11 pieces along both the X and Y directions in accordance with image height, a total of 121 pixels 31 must be simulated.

(4) Based on a calculation result obtained at (3), an optimal shift Δ of each microlens 19 at each image height is calculated.

(5) A graph (a contour drawing) is created in accordance with the optimal shift Δ of each microlens 19 obtained at (4).

(6) Based on the contour drawing obtained at (5), the layout of microlenses 19 is designed (the arrangement pitch L (LL, LR) is determined).

It is to be noted that, although also depending on the characteristics of the camera lenses 21 and/or the layout of each pixel 31, an area with large shift Δ variation can be divided into more regions along the image height through study on the obtained contour drawing for the simulation.

Furthermore, the simulation can be performed for all the pixels 31 to calculate "the shift of the microlens—optical sensitivity dependence".

Figure 7:
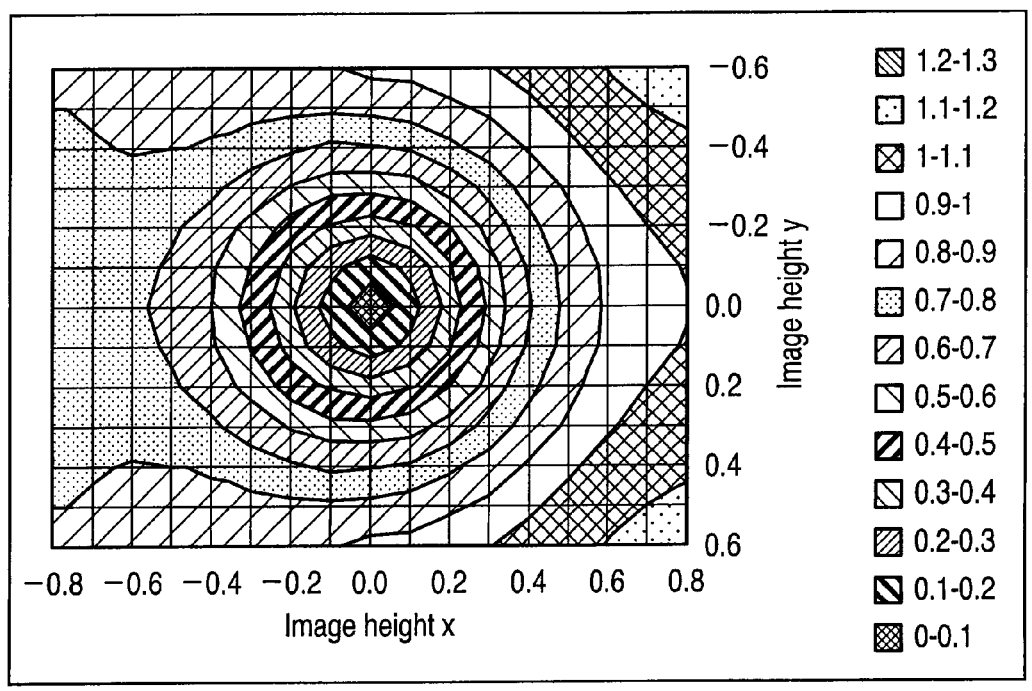
FIG. 7 is a view for explaining the method of optimally setting the shift of the microlens as depicted in FIG. 6.

FIG. 7 shows an example of the contour drawing obtained by the above-described method. This is an example where an optimal shift Δ of the microlens 19 in the right peripheral portion of the image area 11a is larger than that in the left peripheral portion.

That is, this contour drawing represents a distribution of the optimal shift Δ of the microlens 19. As can be seen from this drawing, the closer to the edge of the image area 11a the position is, i.e., the larger an image height X (an image height in the X direction) and an image height Y (an image height in the Y direction) is, the larger the optimal shift Δ of the microlens is. In particular, the optimal shifts Δ in the top-right peripheral portion and the bottom-right peripheral portion of the image area 11a are larger than those in the left peripheral portion.

Actually laying out microlenses 19 based on this contour drawing can optimally set the shift Δ of the microlens 19 in both the left and right peripheral portions in the image area 11a. Therefore, an angle at which incident light enters each pixel can be optimized in both the left and right peripheral portions of the image area 11a, thereby enabling efficiently receiving the incident light. That is, occurrence of the loss of the incident light due to the blockade by interconnects 17 in pixels can be suppressed, and light condensing efficiencies in all the photodiodes 13 can be improved.

Figure 8A:
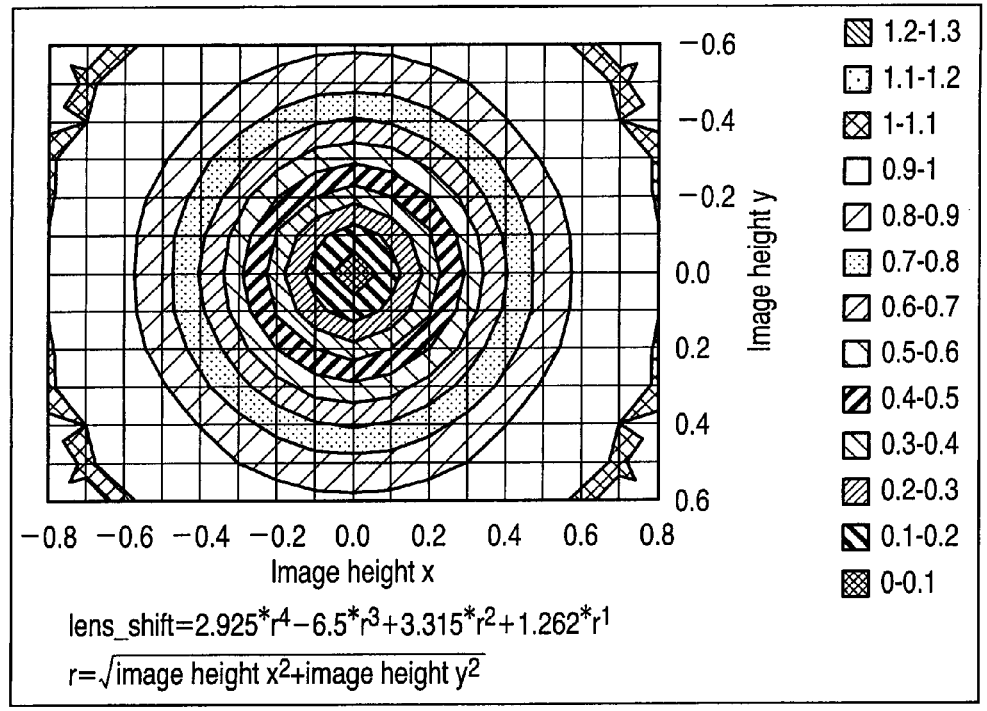
FIGS. 8A and 8B are views for explaining the method of optimally setting the shift of the microlens as depicted in FIG. 6.
Figure 8B:
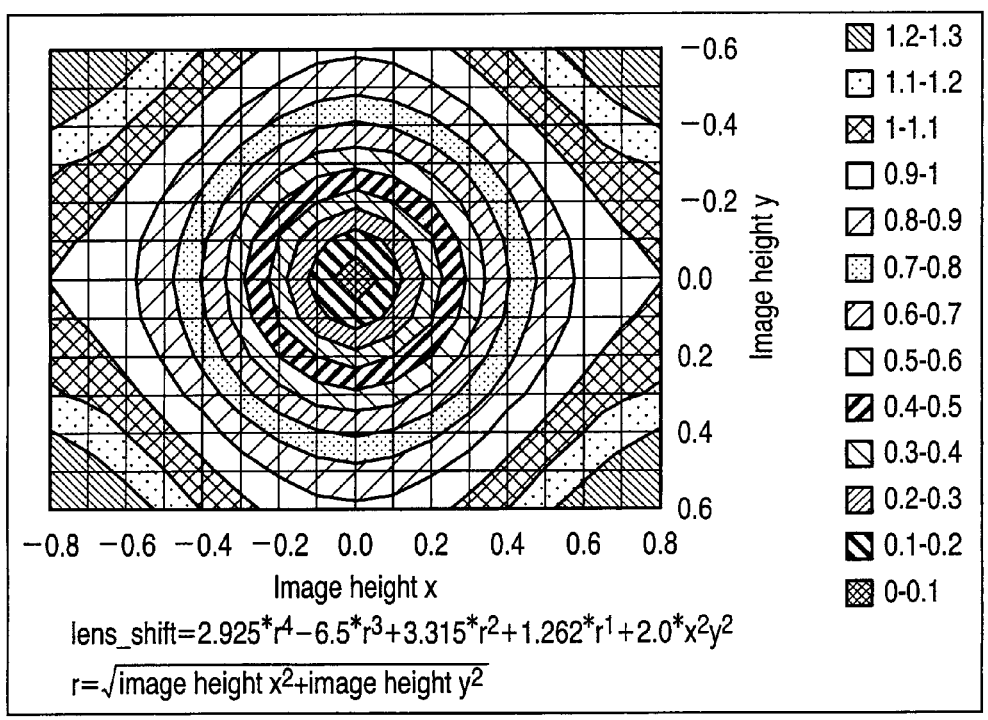

FIGS. 8A and 8B show examples where a distribution of the optimal shift (lens_shift) of the microlens 19 is obtained based on an expression depicted therein.

Each of FIGS. 9A and 9B and FIG. 10 shows a conventional structure of a CMOS image sensor for comparison with the CMOS image sensor according to this embodiment. That is, this conventional example corresponds to a case where an arrangement pitch L of microlenses is the same in left and right peripheral portions of an image area. FIG. 9A is a plan view of the image area in the conventional example, FIG. 9B is a cross-sectional view taken along line IXB-IXB in FIG. 9A, and FIG. 10 shows a relationship between arrangement pitches of photodiodes and microlenses at each image height.

That is, as shown in FIGS. 9A and 9B, in a CMOS image sensor 100, incident light from a camera lens (not shown) enters photodiodes 113 at a slant in pixels in the peripheral portion of an image area 111a. Moreover, a distance from a photodiode 13 to a corresponding interconnect 117 differs between the left side and the right side of the image area 111a. Therefore, in each pixel in the peripheral portion of the image area 111a, a position of a microlens 119 is arranged to be shifted toward the center of the image area 111a, thereby enabling efficiently receiving the incident light in the entire image area 111a.

In this conventional example, an arrangement pitch L of the microlenses 119 is uniform (L12=L23=L34=L45) in the image area 111a, and an arrangement pitch P of the photodiodes 113 is also uniform (P12=P23=P34=P45). Additionally, the arrangement pitch L of the microlenses 119 is smaller than the arrangement pitch P of the photodiodes 113 (L12=L23=L34=L45<P12=P23=P34=P45). That is, the larger the image height is, i.e., the closer to the edge of the image area 11a the pixels are, the larger the shift Δ between the microlenses 119 and photodiodes 113 are (Δa=Δe>Δb=Δd>Δc, and Δc=0).

Reference number 111 in the drawing denotes a semiconductor substrate and reference number 115 designates a translucent film.

For example, as shown in FIG. 10, in this conventional example, the arrangement pitch P of the photodiodes 113 is fixed to 3.30 μm and the arrangement pitch L of the microlenses 119 is fixed to 3.26 μm at any image height.

That is, the shift Δ of the microlens 119 from the corresponding photodiode 113 is a simple function of the image height, and shifts Δ are equal in corresponding two pixels in the left and right peripheral portions of the image area 111a (Δa=Δe, Δb=Δd). Therefore, if the shift Δa and Δb of the microlens 119 in pixels in the left peripheral portion of the image area 111a from the center of the corresponding photodiode 113 toward the center of the image area 111a is optimally set, the shift Δe and Δd in pixels in the right peripheral portion are not optimum, resulting in reduced optical sensitivity in these pixels. In contrast, if the shift Δe and Δd of the microlens 119 in pixels the right peripheral portion of the image area 111a from the center of the corresponding photodiode 113 toward the center of the image area 111a is optimally set, the shift Δa and Δb in pixels in the left peripheral portion are not optimum, resulting in reduced optical sensitivity in these pixels. As described, the conventional CMOS image sensor 100 could not compensate for decreased optical sensitivity caused by the non-isotropic of the pixels layout (asymmetrical in at least the X direction) to increase light condensing efficiencies in the photodiodes 113 in the entire image area 111a.

On the other hand, this embodiment has non-uniform arrangement pitch L of the microlenses 19 in the image area 11a, as shown in FIGS. 1A and 1B. That is, in the image area 11a where the pixels 31 each configured as described in FIGS. 4A to 4C are laid out, the microlenses 19 in the right peripheral portion have the smaller arrangement pitch LR (the larger shifts Δ) than the arrangement pitch LL of those in the left peripheral portion. With this reason, this embodiment provides an advantage that light condensing efficiencies for incident light entering the photodiodes 13 at a slant can be increased in the entire image area 11a.

That is, the shift Δ of the microlens 19 from the center of the corresponding photodiode 13 is optimally set at each image height to result in the maximum optical sensitivity in each pixel 31. As a result, even with miniaturized pixels 31, light from the camera lenses 21 into the photodiodes 13 does not decrease due to the blockade by the interconnects 17 in the left and right peripheral portions of the image area 11a, thereby assuring nearly the same light condensing efficiencies for the incident light in all the photodiodes 13.

As described above, according to this embodiment, the arrangement pitch of the microlenses can be independently set in each pixel in both the left and right peripheral portions of the image area. That is, the shift of the microlens from the corresponding photodiode can be optimally set at each image height. As a result, even if the optimal shift of the microlens differs in the left and right peripheral portions of the image area due to the asymmetry (non-isotropy) of the layout of the pixels, the blockade of a part of incident light by the interconnects to decrease it can be avoided. Therefore, nearly the same light condensing efficiencies for the incident light in the photodiodes can be assured in the entire image area.

In particular, since the incident light from the camera lens can be efficiently received in all the photodiodes in the image area, a reduction in light condensing efficiencies in the peripheral portion of the image area can be improved, and appropriate shading correction (a reduction in shading) can be carried out.

Note that although description is given of the example where the optimal shift of the microlens differs in the left and right peripheral portions of the image area in the embodiment, the present invention is not exclusive to this embodiment. For example, it can be likewise applied to a pixels layout which is non-isotropic in the up-and-down direction (the Y direction) of the image area. In this case, setting the arrangement pitch of the microlenses to differ in upper and lower peripheral portions of the image area (or, optimally setting the shift Δ in each pixel in both the upper and lower peripheral portions of the image area) can assure nearly the same light condensing efficiencies for incident light entering at a slant in all the photodiodes in the image area including the pixels in the upper and lower peripheral portions.

Alternatively, setting the arrangement pitch of the microlenses to differ in an x-shaped (diagonally) 45° direction and a +-shaped (left-and-right and up-and-down) direction of the image area can also assure nearly the same light condensing efficiencies for incident light entering at a slant in all the photodiodes in the image area.

In general, the layout of the interconnects in pixels is often nearly rectangular (including a square). This is because the interconnects that drive the pixels often run along a horizontal direction and those that is used to read a signal charge of the pixels often run along a vertical direction.

When the layout of the interconnects is nearly rectangular, in the pixels in the x-shaped direction of the image area, an opening width of the interconnects (one diagonal line in an active region of the photodiode which is exposed between the interconnects) is long as seen from incident light from the camera lens. As a result, a relationship between the shift of the microlens and the optical sensitivity necessarily differs in the x-shaped direction and the +-shaped direction. Therefore, setting the arrangement pitch of the microlenses to differ in the x-shaped direction and the +-shaped can improve the light condensing efficiencies in all the photodiodes.

This embodiment can also improve the shading characteristics when applied to a linear sensor as well as the area sensor.

Although the description is given of the microlenses that condense light from the camera lens, the same advantages can be expected for light from so-called interlayer lenses. Moreover, it is needless to say that the embodiment is also effective when both the microlenses and the interlayer lenses are used.

Although the embodiments can also be applied to a CCD image sensor, advantages are particularly significant when applied to the CMOS image sensor. That is because a distance between each photodiode and the corresponding microlens is relatively larger in the CMOS image sensor than in the CCD image sensor.

Further, the embodiments are not exclusive to use of the camera lens having the lens characteristics which conform to paraxial beam approximation. For example, the embodiments can also be applied to use of camera lens having lens characteristics which do not conform to the paraxial beam approximation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:
   a plurality of photoelectric converting sections arranged in an image area; and
   a plurality of condensing lenses arranged above the photoelectric converting sections,
   wherein the condensing lenses include a plurality of first condensing lenses and a plurality of second condensing lenses, the first condensing lenses are arranged in a peripheral portion in a first direction in the image area at a first pitch, and the second condensing lenses are arranged in a peripheral portion in a second direction opposite the first direction with respect to a center of the image area at a second pitch, and
   wherein the second pitch is smaller than the first pitch.

2. The device according to claim 1, wherein the plurality of photoelectric converting sections are arranged at a third pitch.

3. The device according to claim 2, wherein the third pitch is larger than the first pitch.

4. The device according to claim 1, further comprising a plurality of light shielding sections provided adjacent to each of the photoelectric converting sections.

5. The device according to claim 4, wherein a side of the shielding sections in the first direction overlap with at least a part of the photoelectric converting sections.

6. The device according to claim 4, wherein the light shielding sections are electrodes or wirings.

7. A solid-state imaging device comprising:
   a first photoelectric converting section arranged in a peripheral portion of an image area;
   a first condensing lens arranged above the first photoelectric converting section; and
   a first light shielding section provided adjacent to the first photoelectric converting section in a side of a center direction of the image area, the first light shielding section overlapping with at least a part of the first photoelectric converting section;
   a second photoelectric converting section arranged in a peripheral portion of the image area;
   a second condensing lens arranged above the second photoelectric converting section; and
   a second light shielding section provided adjacent to the second photoelectric converting section in a side of a peripheral direction of the image area, the second light shielding section overlapping with at least a part of the second photoelectric converting section,
   wherein the first condensing lens includes a first shift from a center of the first photoelectric converting section to a center direction of the image area
   wherein the second condensing lens includes a second shift from the center of the first photoelectric converting section to the center direction of the image area, and
   wherein the first shift is smaller than the second shift.

8. The device according to claim 7, wherein the first photoelectric converting section and the second photoelectric converting section are displaced at a first distance from the center of the image area.

9. The device according to claim 7, further comprising a third light shielding section provided adjacent to the first photoelectric converting section in the side of the center direction of the image area, the third light shielding section not overlapping with at least a part of the first photoelectric converting section.

10. The device according to claim 9, further comprising a fourth light shielding section provided adjacent to the second photoelectric converting section in the side of the peripheral direction of the image area, the fourth light shielding section not overlapping with at least a part of the second photoelectric converting section.

* * * * *